(12) United States Patent
Brinz et al.

(10) Patent No.: US 6,811,656 B2
(45) Date of Patent: Nov. 2, 2004

(54) METHOD FOR CREATING A MATERIAL LIBRARY

(75) Inventors: Thomas Brinz, Bissingen (DE); Ilona Ullmann, Ditzingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/176,431

(22) Filed: Jun. 20, 2002

(65) Prior Publication Data

US 2003/0000845 A1 Jan. 2, 2003

(30) Foreign Application Priority Data

Jun. 20, 2001 (DE) .......................................... 101 29 670

(51) Int. Cl.[7] .......................... C23C 14/34; B05D 3/00; C25D 5/34

(52) U.S. Cl. ...................... 204/192.13; 427/8; 427/300; 427/307; 427/314; 205/205; 205/209; 205/210; 216/44

(58) Field of Search ......................... 204/192.1, 192.12, 204/192.32, 192.13; 205/205, 209, 210; 427/300, 307, 314, 8; 216/44

(56) References Cited

U.S. PATENT DOCUMENTS 5,770,096 A * 6/1998 Lee .............................. 216/41
5,869,140 A * 2/1999 Blohowiak et al. ......... 427/307
RE36,475 E * 12/1999 Choi ........................... 438/628

* cited by examiner

Primary Examiner—Steven Versteeg
(74) Attorney, Agent, or Firm—Kenyon & Kenyon

(57) ABSTRACT

A method for creating a material library of surface areas having different properties in which a substrate is coated. The substrate is subjected to a combined pretreatment procedure.

15 Claims, 1 Drawing Sheet

METHOD FOR CREATING A MATERIAL LIBRARY

FIELD OF THE INVENTION

The present invention relates to a method for creating a material library of surface areas having differing properties.

BACKGROUND INFORMATION

A method of this type is known from practice and is used in the field of surface coating technology.

In one familiar method of the type cited above, representing a combined method, a surface of a substrate, for example, the surface of a ceramic, is coated in differing areas using differing substances, i.e., coating materials. The individual areas, each coated in a different manner, have different chemical and/or physical properties, which are a function of the specific coating material.

In addition, it is known to influence the physical, or chemical, properties of a substrate that is coated using a coating material by pretreating the substrate before the coating is applied. This can be done, for example, using liquids or gases.

SUMMARY OF THE INVENTION

The method according to the present invention for creating a material library of surface areas having differing properties in which the substrate is subjected to a combined pretreatment procedure, has the advantage that within a brief time after an automated procedure—for example, using a robot—the substrate can be pretreated in an area-specific manner, and therefore areas can be generated having the most widely varying chemical and/or physical properties.

This pretreatment procedure, which is carried out before the coating of the substrate is applied, is especially advantageous if the physical and/or chemical properties of a surface system, composed of a substrate and a coating, are optimized with respect to specific parameters. For example, the substrate can include many dozens of defined areas, each of which is subjected to a different pretreatment.

The substrate to be pretreated can be any material, for example, a glass, a ceramic, a metal, or a plastic.

The combined pretreatment procedure, which is advantageously carried out in an area-specific manner, can include a treatment of the substrate using varying liquids and, in another embodiment, can include a treatment using varying gases. Of course, it is also conceivable to pretreat certain areas using a gas and other areas using a liquid.

The liquids can be, for example, sodium chloride solutions, sodium hydroxide solutions, and hydrochloric acid solutions of the most widely varying concentrations.

As pretreatment gases, for example, ammonia, carbon dioxide, and/or hydrogen can be used. In this context, the gas pressure can be varied.

It is also conceivable to subject the substrate in specific areas to an epitaxial vapor deposition procedure as a pretreatment.

Alternatively or additionally, the combined pretreatment procedure can also include area-specific sputtering processes, in which different materials are applied in different areas of the substrate. In this specific embodiment, the substrate functions as a base substrate. The deposited materials and the substrate, which functions here as a base substrate, in turn constitute the workpiece that is coated.

Moreover, the combined pretreatment procedure can include area-specific heat treatments. This means that the substrate in different areas is subject to different heat treatments. In this context, the duration of the heat treatment and/or the temperature applied in each case are varied from area to area.

The substrate can include heater patterns. This is especially advantageous if the combined pretreatment procedure includes area-specific heat treatments. The heater patterns can in turn be designed within the substrate so as to be different in specific areas. These differences can be achieved by varying an imprinted heater pattern with regard to its imprinting width and/or its number of printed circuit traces.

Alternatively, the area-specific heat treatments can be carried out using a laser. For example, one area of the substrate can be irradiated for 10 minutes, and another area of the substrate can be irradiated for 5 minutes. This can result, for example, in these two areas having different heat conductivities.

The pretreatment can thus be carried out in a fundamentally wet-chemical manner, using gases, in a thermal manner, or even using solid-dosing. It is, of course, also conceivable that individual areas of the substrate are subjected to different pretreatments, for example, a wet-chemical and a thermal pretreatment.

To be able to carry out the combined pretreatment procedure in a controlled, area-specific manner, it is advantageous to use a mask, preferably a Teflon mask. A mask of this type makes it possible, e.g., in the application of lacquer, to use a greater quantity of liquid than would be the case in an application by drops, without a mask.

According to one advantageous embodiment of the method in accordance with the present invention, the substrate is coated using a selected surface material. Using this surface material, the target variable that is necessary as a function of the application area can then be tested. The target variable can be, for example, the surface hardness, the resistance to tearing of the coating, or the structural properties of the system composed of the coating and the substrate. The analysis of the properties is carried out using the usual measuring methods.

The coating of the substrate having the surface material can be applied over the entire surface. In this case, in accordance with one advantageous embodiment of the method according to the present invention, the coating is applied using spin-on deposition.

However, the coating having the surface material can also be applied in patterns. This means that the substrate is coated using the surface material in an area-specific manner. By way of example, the mask used for the combined pretreatment can be employed for this purpose. For example, the coating can be applied in drops onto the substrate in an area-specific manner.

DETAILED DESCRIPTION

Figure 1:
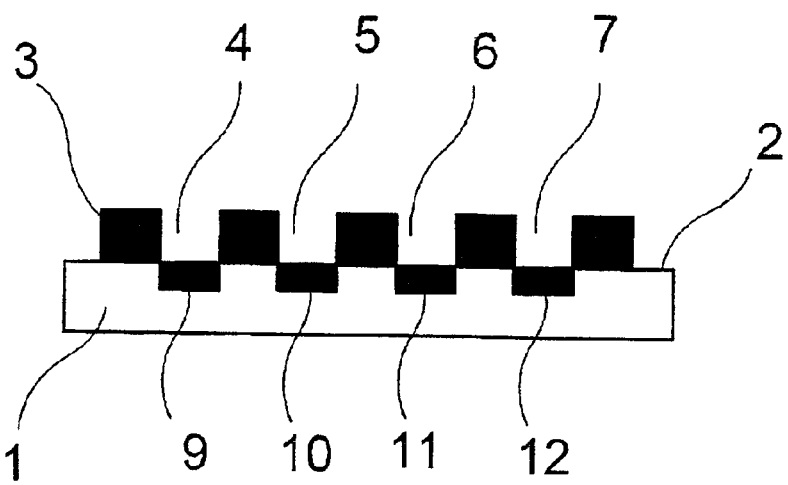
FIG. 1 depicts a schematic representation of a method step in a wet-chemical, combined pretreatment of the substrate.

In FIG. 1, a substrate 1 is depicted that is manufactured from a ceramic material. Substrate 1 has a surface 2, on which a mask 3 made of Teflon is placed. Mask 3 preferably has 64 openings, of which in the highly schematic basic representation in FIG. 1 four openings 4, 5, 6, and 7 are visible, and which expose surface 2 of substrate 1 in areas.

In a combined pretreatment procedure, surface 2 of substrate 1 is pretreated in the area of 64 openings in a wet-chemical manner, in each case in a different way. Surface 2 in an area 9 situated below opening 4 is pretreated using a sodium chloride solution, in an area 10 situated under opening 5 using a sodium hydroxide solution, in an area 11 situated under opening 6 using a hydrochloric acid solution, and in an area 12 situated under opening 7 using a sodium hydrogen carbonate solution, in each case in a specific concentration. The result is in areas 9, 10, 11, and 12, an ionic, a base, an acidic, and a weakly acidic treatment of surface 2 of substrate 1.

Figure 2:
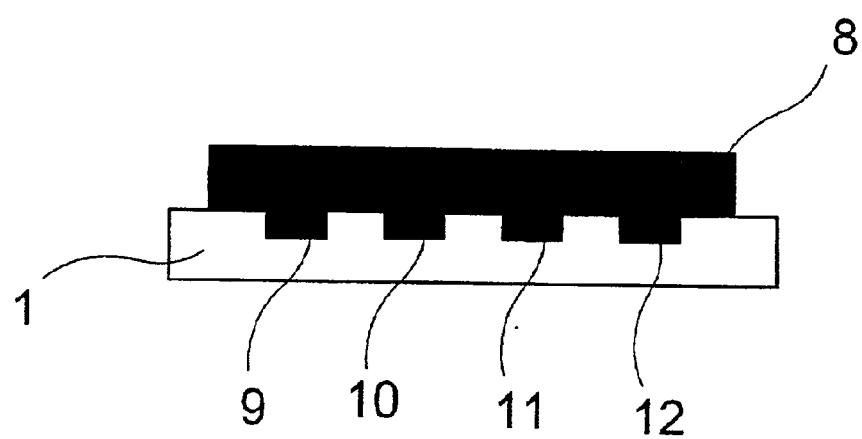
FIG. 2 depicts the substrate according to FIG. 1 having a coating.

After the pretreatment of substrate 1 using the aforementioned solutions, mask 3 is removed. Then a lacquer 8 is applied over the entire surface of substrate 1, for example, in accordance with a spin-on method. The system made of substrate 1 and lacquer 8 is depicted in FIG. 2. In this case, the influence of the pretreatments in areas 9, 10, 11, and 12 on the chemical, or physical, properties of the surface system composed of lacquer 8 and substrate 1 can be determined.

Figure 3:
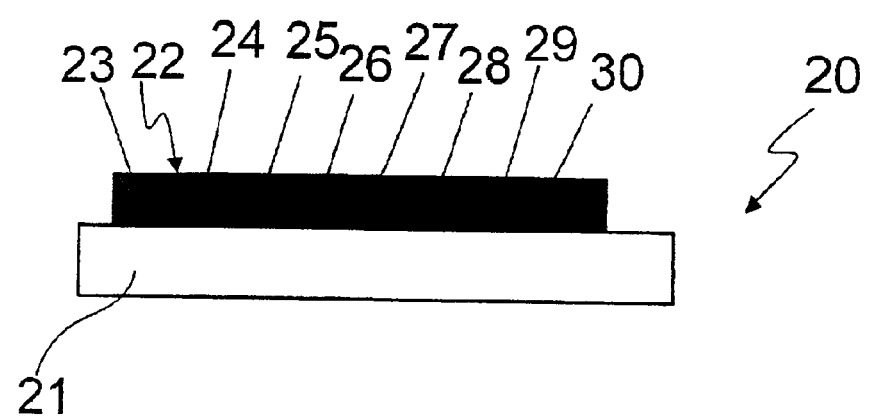
FIG. 3 depicts a substrate that has been pretreated using sputtering processes.

In FIG. 3, a substrate 20 is depicted that is composed of a so-called base substrate 21 and a sputter-deposited coating 22, which is applied in accordance with a combined pretreatment procedure. Coating 22 is subdivided into eight areas 23 through 30. Eight areas 23 through 30 are distinguished in their chemical composition.

Coating 22 forms the surface of substrate 20, onto which a surface material is deposited in accordance with the pretreatment, which is carried out using sputtering. The sputtering represents the pretreatment of substrate 20. The physical/chemical properties of the system composed of the surface material and substrate 20 vary as a function of the chemism in sputter areas 23 through 30.

What is claimed is:

1. A method for creating a material library of surface areas having different properties, comprising:
    subjecting a substrate to a combined pretreatment procedure;
    after the subjecting step, coating the substrate; and
    after the coating step, testing at least one property of a plurality of different systems, each of the different systems including a different coated area of the substrate.

2. The method according to claim 1, wherein the combined pretreatment procedure includes pretreating each of a plurality of different surface areas of the substrate with a different liquid.

3. The method according to claim 1, wherein the combined pretreatment procedure includes pretreating each of a plurality of different areas of the substrate with a different gas.

4. The method according to claim 1, wherein the combined pretreatment procedure includes area-specific sputtering processes.

5. The method according to claim 1, wherein the combined pretreatment procedure includes pretreating each of a plurality of different surface areas of the substrate with a different heat treatment.

6. The method according to claim 5, wherein the substrate includes heater patterns.

7. The method according to claim 1, wherein the combined pretreatment procedure is carried out using a mask.

8. The method according to claim 7, wherein the mask is a polytetrafluoroethylene mask.

9. The method according to claim 1, wherein the substrate is coated using a selected surface material.

10. The method according to claim 9, wherein the coating is carried out over an entire surface.

11. The method according to claim 9, wherein the coating is carried out in a patterned fashion.

12. The method according to claim 1, wherein the testing includes testing a surface hardness of each system.

13. The method according to claim 1, wherein the testing includes testing a resistance to tearing of the coating.

14. The method according to claim 1, wherein the testing includes testing structural properties of each of the systems.

15. A method for creating a material library of surface areas having different properties, comprising:
    subjecting each of a plurality of different surface areas of a substrate to a different pretreatment procedure;
    after the subjecting step, applying a coating to the substrate; and
    testing an influence of the different pretreatment procedures on at least one of a chemical property and a physical property, of a surface system including the coating and the substrate.

* * * * *